(12) United States Patent
Kitazaki

(10) Patent No.: US 6,418,061 B1
(45) Date of Patent: Jul. 9, 2002

(54) NON-VOLATILE SEMICONDUCTOR MEMORY DEVICE PERMITTING DATA-READ OPERATION PERFORMED DURING DATA-WRITE/ERASE OPERATION

(75) Inventor: Kazuhiro Kitazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/529,000

(22) Filed: Mar. 20, 2000

(30) Foreign Application Priority Data

May 11, 1999 (JP) .......................................... 11-130109
Nov. 15, 1999 (JP) .......................................... 11-324339

(51) Int. Cl.[7] .............................................. G11C 16/04
(52) U.S. Cl. .......................... 365/185.29; 365/185.04; 365/185.11; 365/185.28
(58) Field of Search ..................... 365/185.29, 185.04, 365/189.07, 189.03, 189.04, 218, 230.03, 185.11, 185.28

(56) References Cited

U.S. PATENT DOCUMENTS

| 5,269,010 A | * | 12/1993 | MacDonald | 395/425 |
| 5,301,162 A | * | 4/1994 | Shimizu | 365/230.03 |
| 5,594,686 A | * | 1/1997 | Hazen et al. | 365/185.04 |
| 5,822,244 A | * | 10/1998 | Hansen et al. | 365/185.11 |
| 5,999,474 A | * | 12/1999 | Leung et al. | 365/222 |
| 6,088,262 A | * | 7/2000 | Nasu | 365/185.04 |
| 6,125,055 A | * | 9/2000 | Hazen et al. | 365/185.04 |

FOREIGN PATENT DOCUMENTS

| JP | 8-249891 | 9/1996 |
| JP | 10-144086 | 5/1998 |

\* cited by examiner

*Primary Examiner*—Hoai V. Ho
(74) *Attorney, Agent, or Firm*—Arent Fox Kintner Plotkin & Kahn, PLLC

(57) ABSTRACT

A non-volatile semiconductor memory includes a plurality of memory areas, a control unit which performs a data-write or data-erase operation with respect to one of the memory areas, an address-detection unit which detects an address that indicates the one of the memory areas having the data-write or data-erase operation performed therein, and supplies information indicative of the address, and at least one output terminal which supplies the information to an exterior of the device.

17 Claims, 18 Drawing Sheets

F I G. 1 3
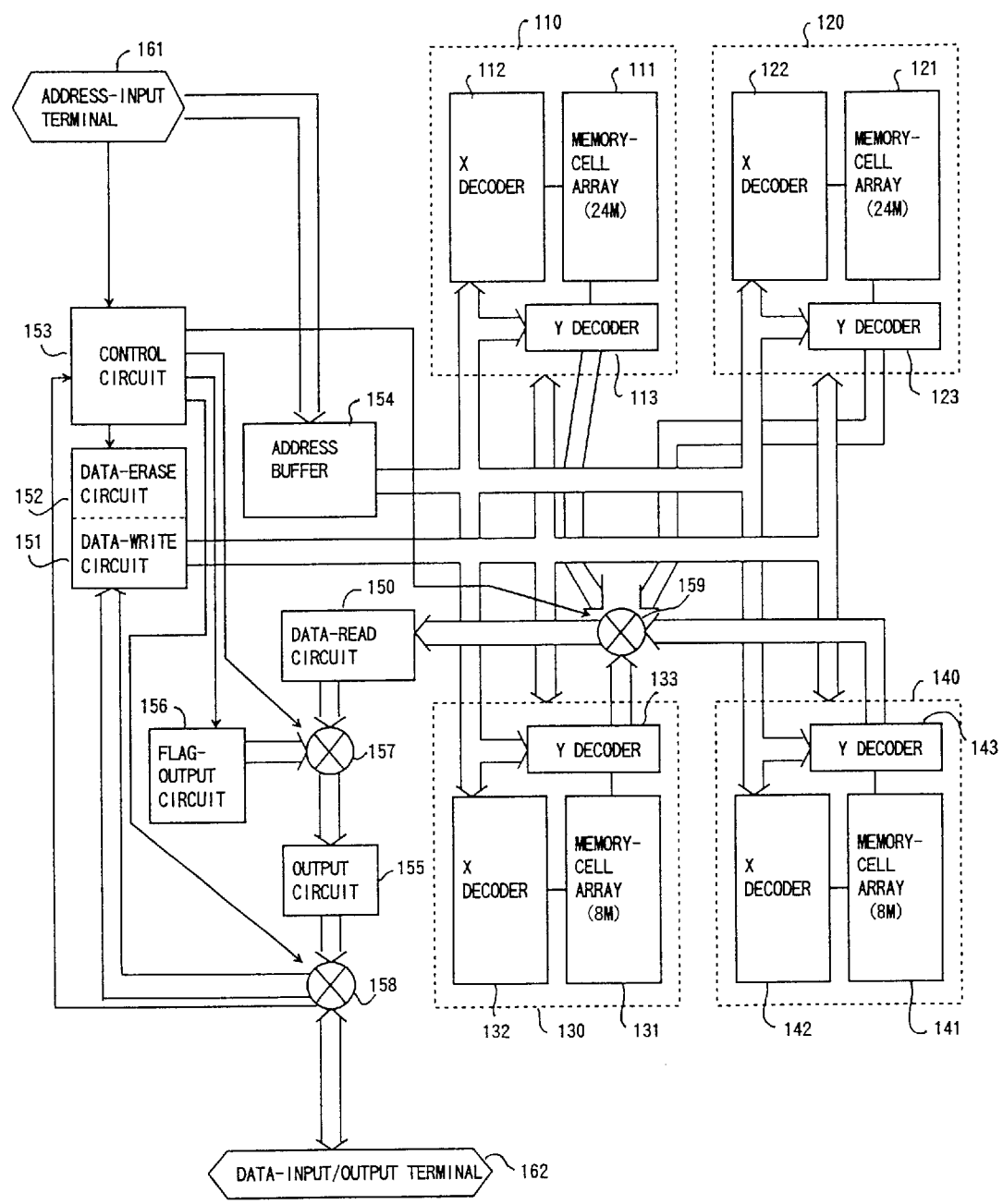

F I G. 1 4

|  | FIRST-BANK TOTAL | SECOND-BANK TOTAL | FIRST BLOCK (24M) | SECOND BLOCK (24M) | THIRD BLOCK (8M) | FOURTH BLOCK (8M) |
|---|---|---|---|---|---|---|
| COMBINATION 1 | 5 6 M | 8 M | FIRST BANK | FIRST BANK | FIRST BANK | SECOND BANK |
| COMBINATION 2 | 4 8 M | 1 6 M | FIRST BANK | FIRST BANK | SECOND BANK | SECOND BANK |
| COMBINATION 3 | 4 0 M | 2 4 M | FIRST BANK | SECOND BANK | FIRST BANK | FIRST BANK |
| COMBINATION 4 | 3 2 M | 3 2 M | FIRST BANK | SECOND BANK | FIRST BANK | SECOND BANK |

F I G. 1 5
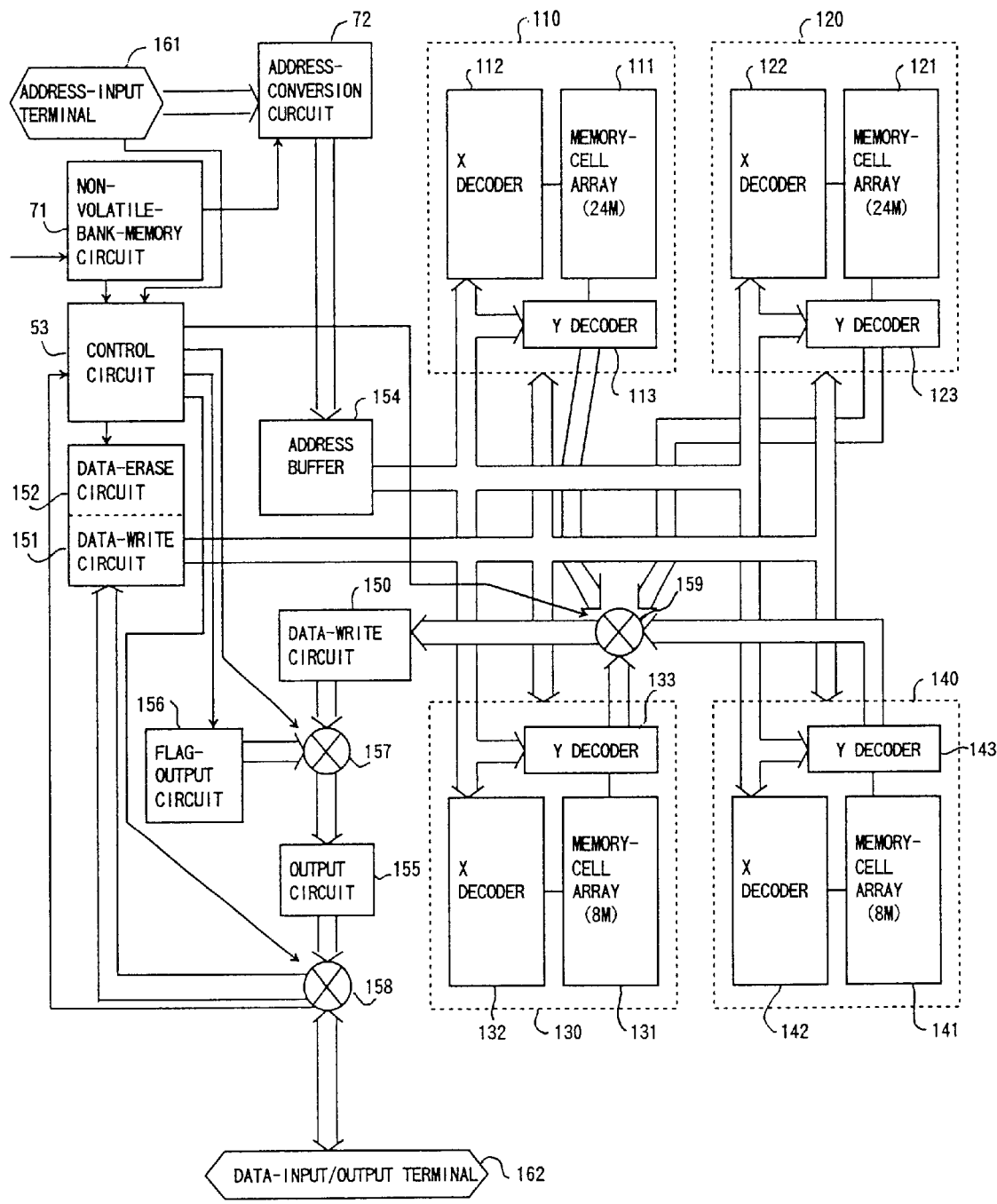

FIG. 16

| BANK ADDRESS | | | BLOCK |
|---|---|---|---|
| A21 | A20 | A19 | |
| L L L | L L H | L H L | FIRST BLOCK |
| L H H | H L L | H L H | SECOND BLOCK |
| H | H | L | THIRD BLOCK |
| H | H | H | FOURTH BLOCK |

F I G. 18

| BANK-INFORMATION SIGNAL | | EXTERNAL ADDRESS | | | INTERNAL ADDRESS | | |
|---|---|---|---|---|---|---|---|
| C3 | C4 | A21 | A20 | A19 | I21 | I20 | I19 |
| H | L | L | L | L | L | L | L |
| | | L | L | H | L | L | H |
| | | L | H | L | L | H | L |
| | | L | H | H | H | H | L |
| | | H | L | L | H | H | H |
| | | H | L | H | L | H | H |
| | | H | H | L | H | L | L |
| | | H | H | H | H | L | H |

| BANK-INFORMATION SIGNAL | | EXTERNAL ADDRESS | | | INTERNAL ADDRESS | | |
|---|---|---|---|---|---|---|---|
| C3 | C4 | A21 | A20 | A19 | I21 | I20 | I19 |
| H | L | L | L | L | L | L | L |
| | | L | L | H | L | L | H |
| | | L | H | L | L | H | L |
| | | L | H | H | H | H | L |
| | | H | L | L | L | H | H |
| | | H | L | H | H | L | L |
| | | H | H | L | H | L | H |
| | | H | H | H | H | H | H |

US 6,418,061 B1

NON-VOLATILE SEMICONDUCTOR MEMORY DEVICE PERMITTING DATA-READ OPERATION PERFORMED DURING DATA-WRITE/ERASE OPERATION

BACKGROUND OF THE INVENTION

1. Field of the Invention

The present invention generally relates to a semiconductor memory device, and particularly relates to a non-volatile semiconductor memory device which permits reading of data during a process of rewriting of data.

2. Description of the Related Art

In recent years, many different types of flash EEPROMs (hereinafter referred to as flash memories) have been launched in the market as main items of a product line covering non-volatile semiconductor memory devices which permit electrical writing and erasing of data.

In general, a flash memory needs a longer time period to complete a data rewriting operation than does a DRAM (dynamic random access memory) or an SRAM (static random access memory). Also, a flash memory does not allow a data reading operation to be performed while a data rewriting operation is being performed.

In order to obviate these inconveniences, a flash memory of a dual-operation type has been developed. This type of flash memory has a plurality of banks of memory-cell arrays for data storage, and allows a data reed operation to be performed in one bank while a data rewrite operation is performed in another bank. Here, the term "bank" refers to one block or a group of two or more blocks, which operates as one data processing unit.

FIG. 1 is a block diagram showing a configuration of a dual-operation-type flash memory.

A flash memory 10 of FIG. 1 includes a bank 1 and a bank 2. The bank 1 includes a memory-cell array 11, an X decoder 12, a Y decoder 13, and a data-read circuit 14. The bank 2 includes a memory-cell array 21, an X decoder 22, a Y decoder 23, and a data-read circuit 24. The flash memory 10 further includes a data-write circuit 31, a data-erase circuit 32, a control circuit 33, an address buffer 34, an address generator 35, an output circuit 36, an address-input terminal 41, a data-input/output terminal 42, and a RD/BY terminal 43.

As can be seen from FIG. 1, the flash memory 10 has the two sets of memory-cell arrays, each of which is provided with the X decoder and the Y decoder for selecting memory cells as well as the data-read circuit for reading data from the selected memory cells. On the other hand, only one set of the data-write circuit 31 and the data-erase circuit 32 is provided and shared by the banks 1 and 2 because these circuits occupy a large chip area. Here, the data-write circuit 31 is used for writing data, and the data-erase circuit 32 is used for erasing data.

With this configuration, the flash memory 10 cannot perform a rewrite operation in the two banks at the same time. It is possible, however, to read data from one bank while rewriting data in the other bank. The term "dual operation" is used for describing such an operation in which a data is read from one bank while data is rewritten in the other bank.

In what follows, a description will be given with regard to the dual operation.

When a command for writing or erasing data in the bank 1 is entered, the address buffer 34 stores therein an address at which data is written or erased. The data-write circuit 31 uses the data-write circuit 31 or the data-erase circuit 32 to write or erase data at the specified address. In the case of data-write operation, data to be written is entered from the data-input/output terminal 42, and is supplied to the date-write circuit 31.

While the data-write or data-erase operation as described above is underway, a read address is supplied to the address-input terminal 41. In response, the control circuit 33 controls the address buffer 34 to supply the read address to the bank 2 rather than supplying it to the bank 1. The bank 2 has its own set of the X decoder 22, the Y decoder 23, and the data-read circuit 24 separate from that of the bank 1, so that data can be read from memory cells of the memory-cell array 21.

The read address entered during an ongoing data-write or data-erase operation needs to be an address that is included in a bank different from the one that is undergoing the data-write or data-erase operation. Data read from the memory cells is output from the data-input/output terminal 42.

The flash memory 10 has the RD/BY terminal 43 for outputting a signal indicative of whether a date-write or data-erase operation is underway. When a signal output at the RD/BY terminal 43 is HIGH, for example, it generally indicates that no data-write or data-erase operation is underway in the flash memory 10, and that data can be read. When a signal output at the RD/BY terminal 43 is LOW, on the other hand, it generally indicates that there is an ongoing data-write or data-erase operation in the flash memory 10, and that data cannot be read.

In the flash memory 10 of FIG. 1, the signal output at the RD/BY terminal 43 is LOW when one of the banks is undergoing a data-write or data-erase operation. A data-read operation directed to the other bank, however, is not prohibited.

Data erasure in a flash memory is performed block by block, and the block used as a unit of erasure is generally referred to as a sector. In a flash memory of a dual-operation type as shown in FIG. 1, when a plurality of sectors are to be erased, these sectors may exist in more than one bank.

Data erasure is successively performed sector by sector. The problem is that it is impossible to detect, in realtime, a timing at which a data-erase operation is switched from one bank to the other. That is, it is impossible to detect, from outside the flash memory 10, which one of the banks is ready to perform a data-read operation. This is because the RD/BY terminal 43 outputs a LOW signal when either one of the banks is undergoing a data-write or data-read operation, and there is no way to ascertain which one of the banks is undergoing the data-write or data-read operation.

Accordingly, there is a need for a non-volatile semiconductor memory device which allows a data-read operation to be performed concurrently with a data-write or data-erase operation, and allows validity of read data to be checked from outside the semiconductor memory device.

SUMMARY OF THE INVENTION

It is a general object of the present invention to provide a non-volatile semiconductor memory device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to teachings provided in the description. Objects as well as other features and advantages of the present invention will be realized and attained by a non-volatile semiconductor memory device particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a non-volatile semiconductor memory device including a plurality of memory areas, a control unit which performs a data-write or data-erase operation with respect to one of the memory areas, an address-detection unit which detects an address that indicates the one of the memory areas having the data-write or data-erase operation performed therein, and supplies information indicative of the address, and at least one output terminal which supplies the information to an exterior of the device.

Further, the invention provides a non-volatile semiconductor memory device including three or more memory-cell blocks, a control unit which organizes the memory-cell blocks into a plurality of groups, and controls the memory-cell blocks in each of the plurality of groups to operate as one unit separately from the memory-cell blocks of other groups, a data-write/erase unit which writes or erases data in one of the memory-cell blocks, and a data-read unit which reads data from one of the memory-cell blocks.

According to one aspect of the invention, the non-volatile semiconductor memory device as described above is such that the control unit controls the data-read unit to read data from one of the memory-cell blocks that is different from one of the memory-cell blocks in which the data-write/erase unit is writing or erasing data.

BRIEF DESCRIPTION OF THE DRAWINGS

FIG. 13 is a block diagram of a first embodiment of a semiconductor memory device according to a second principle of the present invention;

FIG. 14 is a table showing different ways four blocks shown in FIG. 13 are combined according to a local-decoding scheme;

FIG. 15 is a block diagram showing a configuration of a non-volatile semiconductor memory device according to a second embodiment of the second principle;

FIG. 16 is a table showing bank addresses for selecting one of the four blocks;

FIG. 18 is a table showing relations between bank address inputs and internal address outputs of the address-conversion circuit.

DESCRIPTION OF THE PREFERRED EMBODIMENTS

In the following, embodiments of the present invention will be described with reference to the accompanying drawings.

Figure 1:
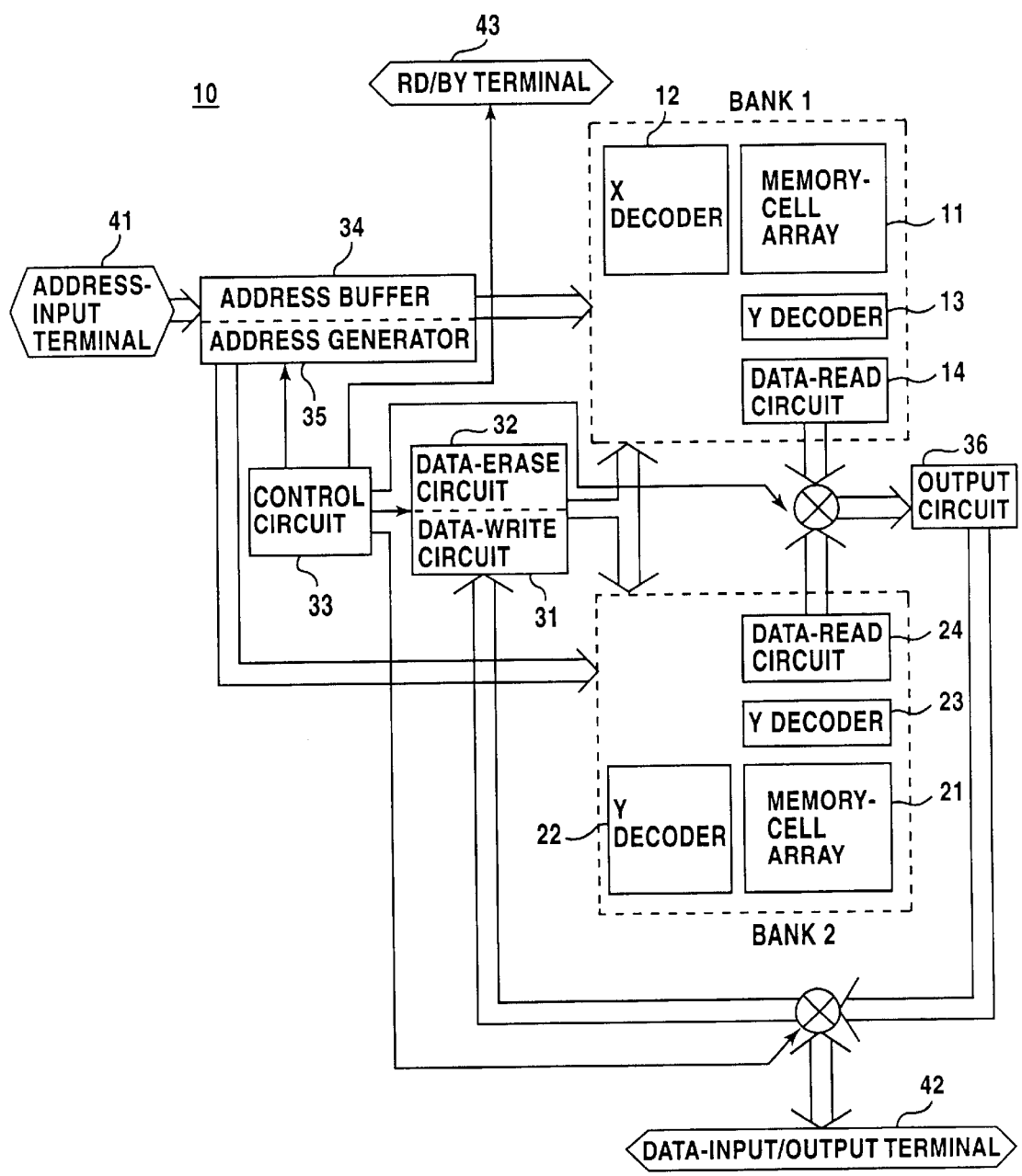
FIG. 1 is a block diagram showing a configuration of a dual-operation-type flash memory.
Figure 2:
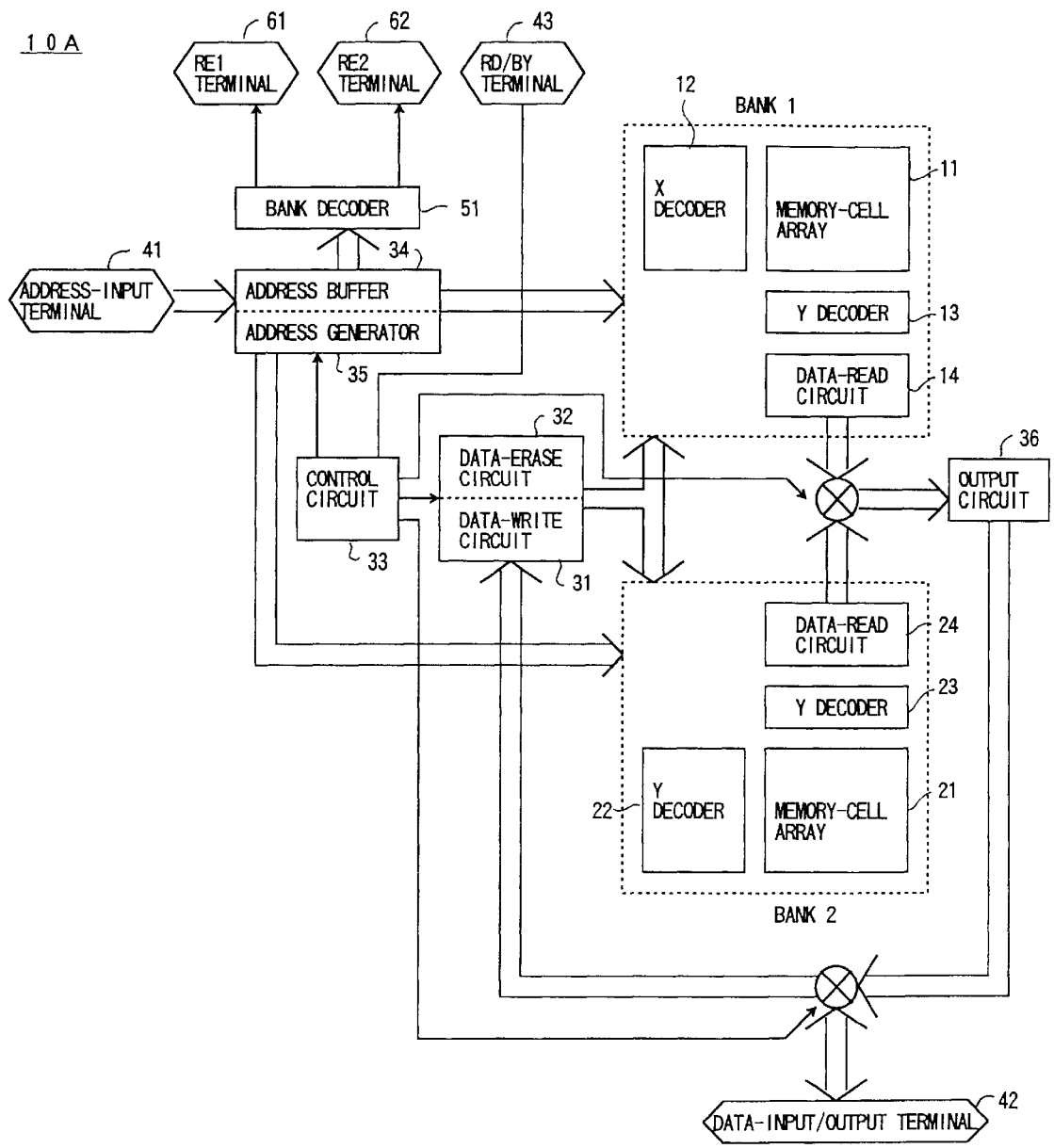
FIG. 2 is a block diagram of a first embodiment of a semiconductor memory device according to the present invention.

FIG. 2 is a block diagram of a first embodiment of a semiconductor memory device according to the present invention. In FIG. 2, the same elements as those of FIG. 1 are referred to by the same numerals, and a description thereof will be omitted. This embodiment will be described with reference to a flash memory as an example, but the present invention is not limited to application to a flash memory.

A flash memory 10A of FIG. 2 includes the bank 1 and the bank 2. The bank 1 includes the memory-cell array 11, the X decoder 12, the Y decoder 13, and the data-read circuit 14. The bank 2 includes the memory-cell array 21, the X decoder 22, the Y decoder 23, and the data-read circuit 24. The flash memory 10A further includes the data-write circuit 31, the data-erase circuit 32, the control circuit 33, the address buffer 34, the address generator 35, the output circuit 36, the address-input terminal 41, the data-input/output terminal 42, the RD/BY terminal 43, a bank decoder 51, a RE1 terminal 61, and a RE2 terminal 62.

As can be seen from FIG. 2, the flash memory 10A has the two sets of memory-cell arrays, each of which is provided with the X decoder and the Y decoder for selecting memory cells as well as the data-read circuit for reading data from the selected memory cells. On the other hand, only one set of the date-write circuit 31 and the data-erase circuit 32 is provided and shared by the banks 1 and 2 because these circuits occupy a large chip area. Here, the date-write circuit 31 is used for writing data, and the data-erase circuit 32 is used for erasing data. Because of this configuration, the flash memory 10A cannot rewrite data in more than one bank at a time.

Since simultaneous data writing or simultaneous data erasure in more than one bank is not attainable, a plurality of sectors are processed one by one when the sectors to be erased reside in more than one bank. Here, the control circuit 33 decides which one of a data-read operation, a data-write operation, and a data-erase operation is to be performed in each bank. Further, the control circuit 33 attends to various control operations as to which one of the banks is to receive an entered address, which one of the banks is to provide a data signal to be output to the exterior of the flash memory 10A, etc.

In what follows, operation of the flash memory 10A shown in FIG. 2 will be described.

When a command for erasing data in the bank 1 is entered, the address buffer 34 stores therein an address of the data to be erased from the bank 1. The address generator 35 selects a sector to be erased, and selects a bank address of a bank that includes the selected sector. The address generator 35 supplies the selected sector address and the selected bank address to the bank 1. The data-erase circuit 32 erases the data of the selected sector.

The bank address supplied from the address generator 35 indicates a bank in which a data erasure operation is being performed. The flash memory 10A of FIG. 2 has the bank decoder 51 that decodes this bank address.

The bank decoder 51 decodes the bank address supplied from the address generator 35, and outputs a signal at the RE1 terminal 61 or the RE2 terminal 62 to indicate which one of the banks includes the sector that is undergoing the data-erasure operation. For example, if a bank that includes a sector being deleted is the bank 2, a signal at the RE1 terminal 61 is set to HIGH, and a signal at the RE2 terminal 62 is set to LOW. This combination of signal levels indicates to the exterior of the flash memory 10A that the bank 1 is ready for data-read operation, and the bank 2 is not ready for data-read operation.

Figure 3:
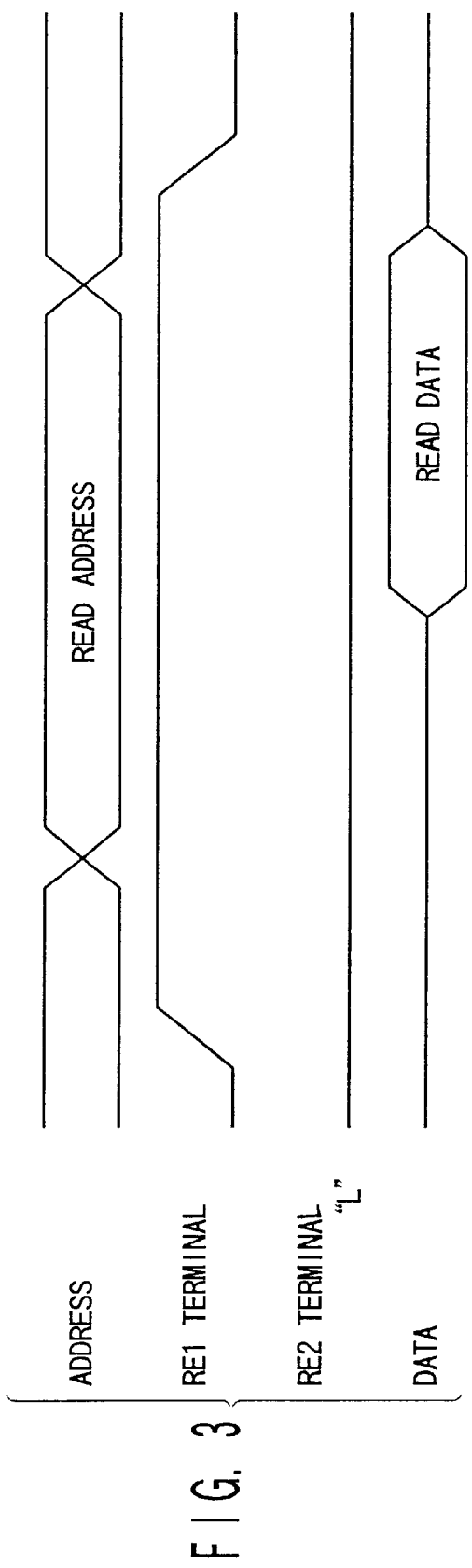
FIG. 3 is a timing chart showing operation of the first embodiment of the semiconductor memory device according to the present invention.

FIG. 3 is a timing chart showing operation of the first embodiment of the semiconductor memory device according to the present invention.

In FIG. 3, the signal output at the RE1 terminal 61 is HIGH, and the signal output at the RE2 terminal 62 is LOW. When these signals are checked from outside the flash memory 10A, the check can reveal that the bank 1 is ready for data-read operation and the bank 2 is not ready for data-read operation.

When a read address is supplied to the address-input terminal 41 at a timing as shown in FIG. 3, data read from the read address is output from the flash memory 10A at a timing as shown at the bottom of FIG. 3. When the data is read from the bank 1, it can be ascertained that the data is valid. If the data is read from the bank 2, on the other hand, one can ascertain that the data is not valid.

In this manner, the flash memory 10A of FIG. 2 is provided with the output terminals for indicating which banks are ready for data-read operation and which bank is not ready for data-read operation. Thus, a check can be made from outside the flash memory 10A as to whether a data-read operation can be performed with respect to each bank.

In the following, a second embodiment of the present invention will be described.

Figure 4:
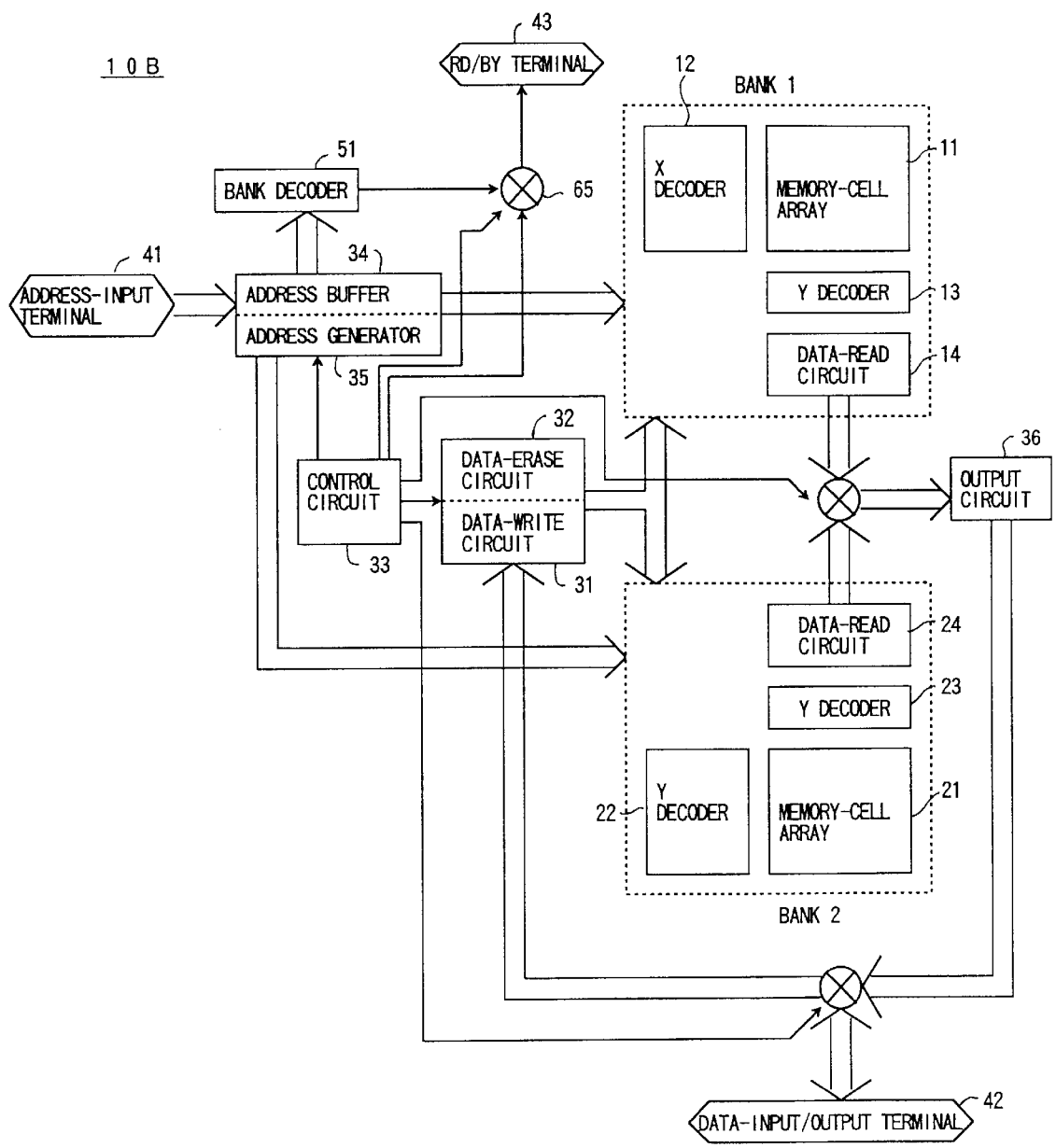
FIG. 4 is a block diagram of a second embodiment of a semiconductor memory device according to the present invention.

FIG. 4 is a block diagram of a second embodiment of a semiconductor memory device according to the present invention. In FIG. 4, the same elements as those of FIG. 2 are referred to by the same numerals, and a description thereof will be omitted. This embodiment will be described with reference to a flash memory as an example, but the present invention is not limited to application to a flash memory.

When there are only two banks in a flash memory, the RD/BY terminal 43 of a conventional configuration can be utilized without a need for providing other dedicated output terminals. A flash memory 10B of FIG. 4 outputs a signal at the RD/BY terminal 43 by supplying the output of the bank decoder 51 to the RD/BY terminal 43 via a selector 65.

The control circuit 33 switches an output of the selector 65 between a signal that is conventionally associated with the RD/BY terminal 43 and a signal that is newly provided in the present invention. Such switching may be made in accordance with a switch command. The selector 65 receives the output signal of the bank decoder 51 and an output signal from the control circuit 33, and selects one of these two output signals under the control of the control circuit 33. The selected signal is supplied to the RD/BY terminal 43.

When the selector 65 is switched such as to output a signal at the RD/BY terminal 43 indicative of which one of the banks is ready for data-read operation, a HIGH signal at the RD/BY terminal 43 may indicate that the bank 1 is in condition ready for data-read operation, and a LOW signal at the RD/BY terminal 43 may indicate that the bank 2 is in condition ready for data-read operation. Such a condition can be readily checked outside the flash memory 10B.

Figure 5:
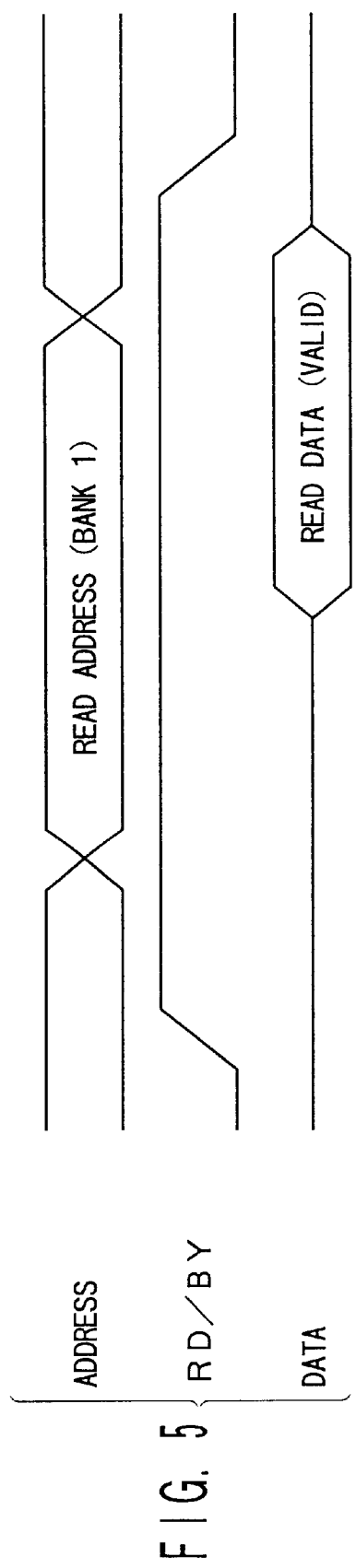
FIG. 5 is a timing chart showing operation of the second embodiment of the semiconductor memory device according to the present invention.

FIG. 5 is a timing chart showing operation of the second embodiment of the semiconductor memory device according to the present invention.

In FIG. 5, the signal output at the RD/BY terminal 43 is HIGH. When this signal is checked from outside the flash memory 10B, the check can reveal that the bank 1 is ready for data-read operation and the bank 2 is not ready for data-read operation.

When a read address is supplied to the address-input terminal 41 at a timing as shown at the top of FIG. 5, data read from the read address is output from the flash memory 10B at a timing as shown at the bottom of FIG. 5. When the data is read from the bank 1, it can be ascertained that the data is valid. If the data is read from the bank 2, on the other hand, one can ascertain that the data is not valid.

In this manner, the flash memory 10B of FIG. 4 is provided with no dedicated output terminals for the purpose of indicating which banks are ready for data-read operation. A check can be made, however, from outside the flash memory 10B based on the conventional RD/BY terminal, as to whether a data-read operation can be performed with respect to each bank.

In what follows, a third embodiment of the present invention will be described.

Figure 6:
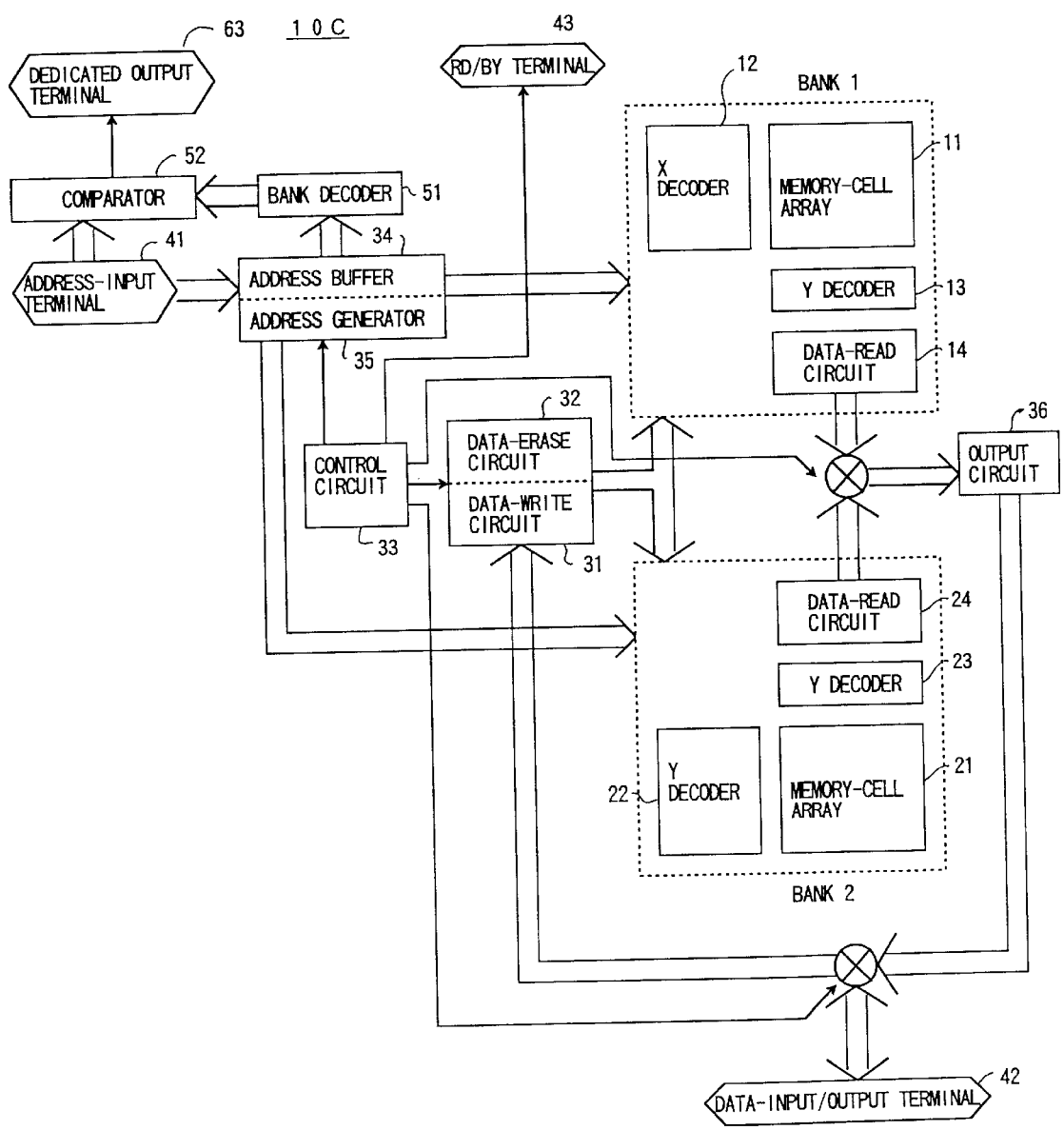
FIG. 6 is a block diagram of a third embodiment of a semiconductor memory device according to the present invention.

FIG. 6 is a block diagram of a third embodiment of a semiconductor memory device according to the present invention. In FIG. 6, the same elements as those of FIG. 2 are referred to by the same numerals, and a description thereof will be omitted. This embodiment will be described with reference to a flash memory as an example, but the present invention is not limited to application to a flash memory.

A flash memory 10C of FIG. 6 includes the bank 1 and the bank 2. The bank 1 includes the memory-cell array 11, the X decoder 12, the Y decoder 13, and the data-read circuit 14. The bank 2 includes the memory-cell array 21, the X decoder 22, the Y decoder 23, and the data-read circuit 24. The flash memory 10C further includes the data-write circuit 31, the data-erase circuit 32, the control circuit 33, the address buffer 34, the address generator 35, the output circuit 36, the address-input terminal 41, the data-input/output terminal 42, the RD/BY terminal 43, the bank decoder 51, a comparator 52, and a dedicated output terminal 63.

The bank decoder 51 decodes a bank address supplied from the address generator 35, and supplies a signal to the comparator 52 to indicate a bank that includes a sector undergoing a data-erasure operation. Further, when a read address is supplied to the address-input terminal 41, a signal indicative of a bank specified by the read address is supplied to the comparator 52. The comparator 52 compares the signal supplied from the bank decoder 51 with the signal supplied from the address-input terminal 41, and provides a signal indicative of a comparison result to the dedicated output terminal 63.

When the comparison by the comparator 52 indicates a match, i.e., when the bank that includes a sector being deleted match the bank that is specified by the read address, the comparator 52 outputs a LOW signal to the dedicated output terminal 63. In this case, the bank specified by the read address is not ready for data-read operation, and it can be learned from outside the flash memory 10C that read data is not valid data.

When the comparison by the comparator 52 indicates no match, i.e., when the bank that includes a sector being deleted does not match the bank that is specified by the read address, the comparator 52 outputs a HIGH signal to the dedicated output terminal 63. In this case, the bank specified by the read address is ready for data-read operation, and it can be learned from outside the flash memory 10C that read data is valid data.

Figure 7:
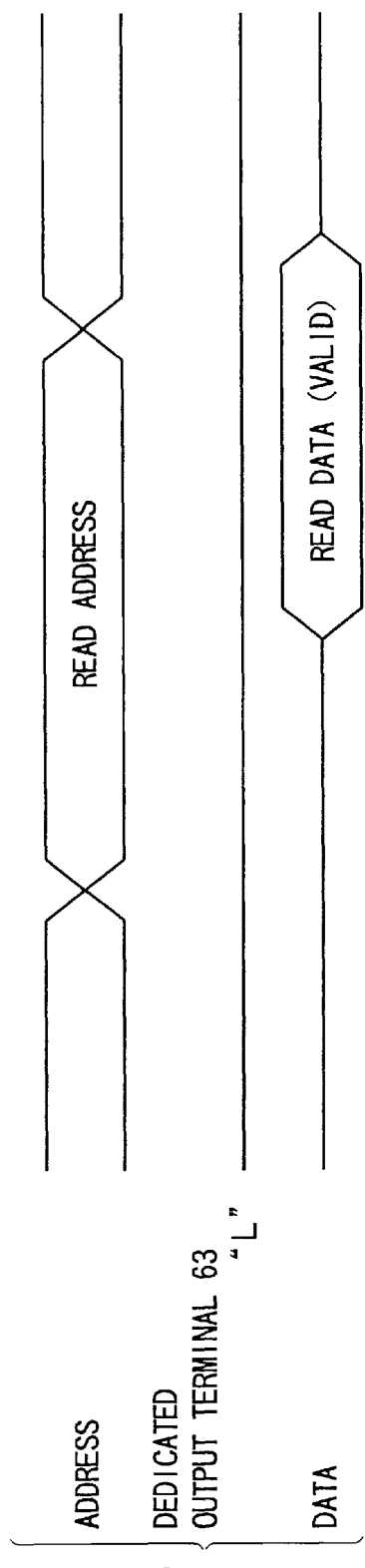
FIG. 7 is a timing chart showing operation of the third embodiment of the semiconductor memory device according to the present invention.

FIG. 7 is a timing chart showing operation of the third embodiment of the semiconductor memory device according to the present invention.

In FIG. 7, the signal output at the dedicated output terminal 63 is LOW. When the signal LOW at the dedicated output terminal 63 indicates a match between the compared banks, it is ascertained that data read as shown at the bottom of FIG. 7 in response to a read address supplied as shown at the top of FIG. 7 is invalid.

Figure 8:
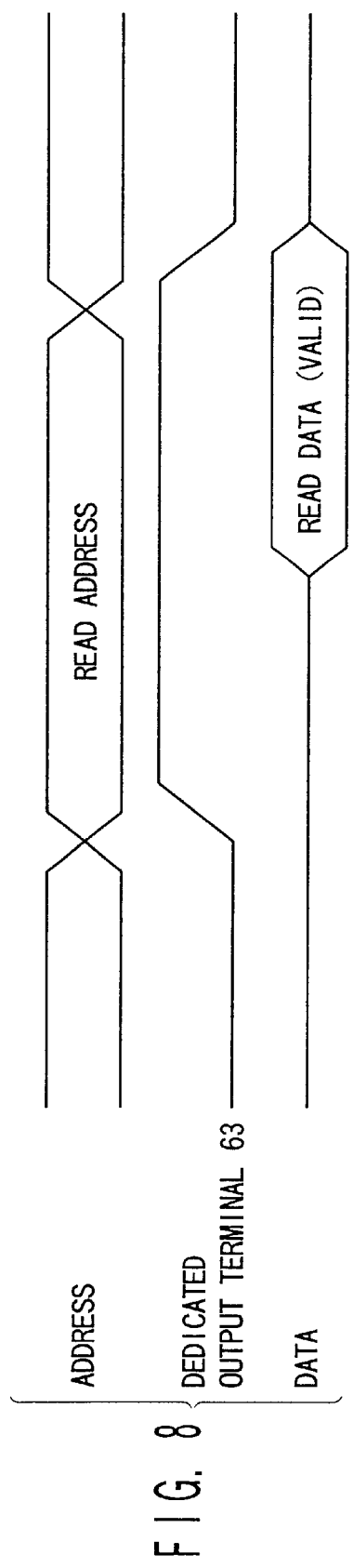
FIG. 8 is another timing chart showing operation of the third embodiment of the semiconductor memory device according to the present invention.

FIG. 8 is another timing chart showing operation of the third embodiment of the semiconductor memory device according to the present invention.

In FIG. 8, the signal output at the dedicated output terminal 63 is HIGH. In this case, it is ascertained that data shown at the bottom of FIG. 8 read in response to a read address shown at the top of FIG. 8 is valid.

In this manner, the flash memory 10C of FIG. 6 compares a first bank address supplied from the address-input terminal 41 with a second bank address supplied form the address generator 35 where the first bank address indicates a bank specified by a read address, and the second bank address indicates a bank that includes a sector being deleted. The flash memory 10C then checks whether the read data is valid or invalid based on the result of the comparison. This configuration is operative regardless of the number of banks provided in the flash memory 10C.

In what follows, a fourth embodiment of the present invention will be described.

Figure 9:
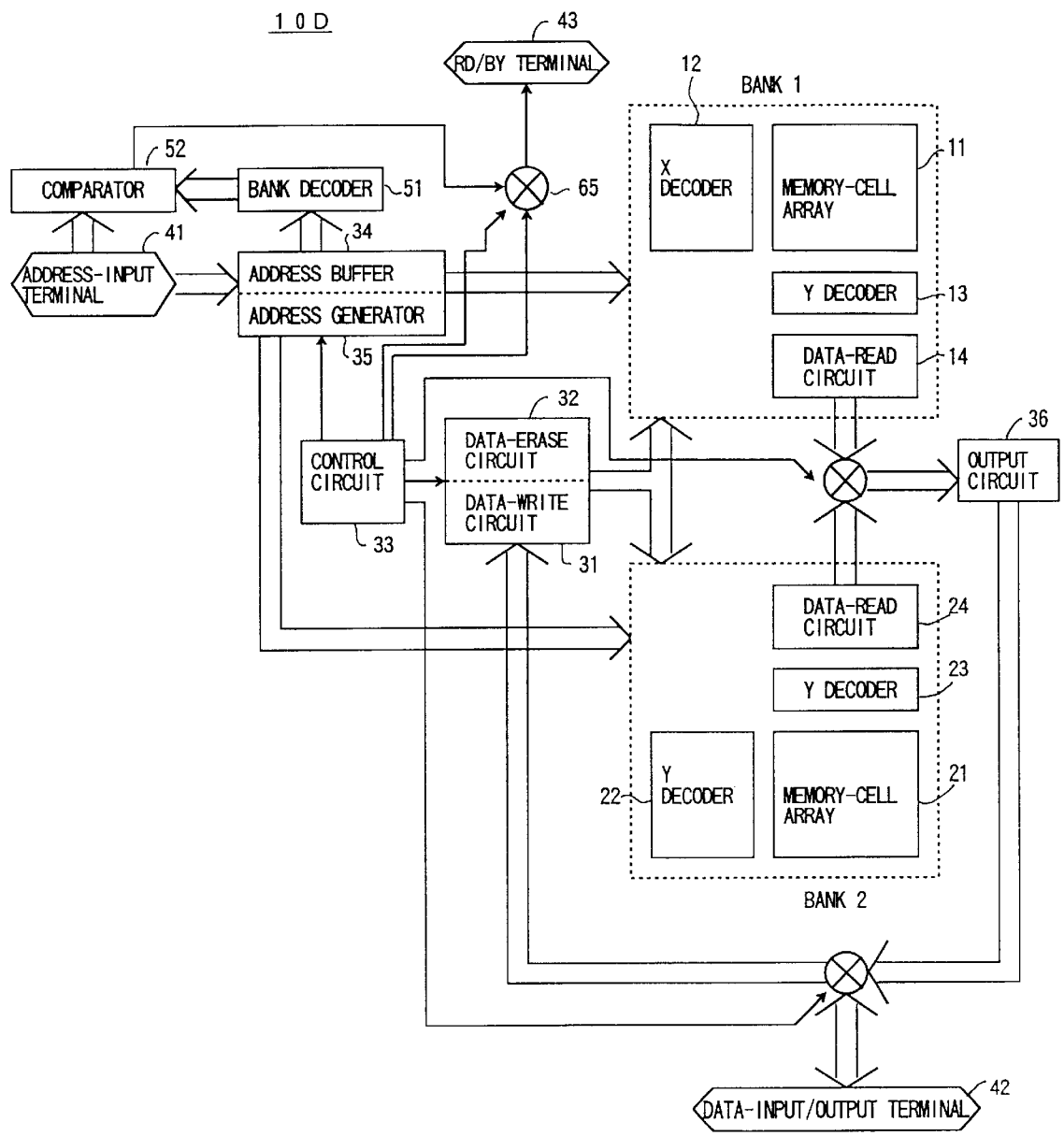
FIG. 9 is a block diagram of a fourth embodiment of a semiconductor memory device according to the present invention.

FIG. 9 is a block diagram of a fourth embodiment of a semiconductor memory device according to the present invention. In FIG. 9, the same elements as those of FIG. 6 are referred to by the same numerals, and a description thereof will be omitted. This embodiment will be described with reference to a flash memory as an example, but the present invention is not limited to application to a flash memory.

The flash memory 10C of FIG. 6 suffers a disadvantage of increase in chip size by having the dedicated output terminal 63 that is provided solely for the purpose of indicating an internal operation status. Alternatively, the RD/BY terminal 43 may be utilized much in the same manner as in the flash memory 10B of FIG. 4.

A flash memory 10D of FIG. 9 supplies an output signal of the comparator 52 to the RD/BY terminal 43 via the selector 65. The control circuit 33 switches an output of the selector 65 between a signal that is conventionally associated with the RD/BY terminal 43 and the signal that is newly provided in the present invention. Such switching may be made in accordance with a switch command. The selector 65 receives the output signal of the comparator 52 and an output signal from the control circuit 33, and selects one of these two output signals under the control of the control circuit 33. The selected signal is supplied to the RD/BY terminal 43.

When the selector 65 is switched such as to output, at the RD/BY terminal 43, a signal indicative of whether read data is valid or invalid, a HIGH signal at the RD/BY terminal 43 may indicate that the read data is valid, and a LOW signal at the RD/BY terminal 43 may indicate that the read data is invalid. Such a condition can be readily checked outside the flash memory 10D.

Figure 10:
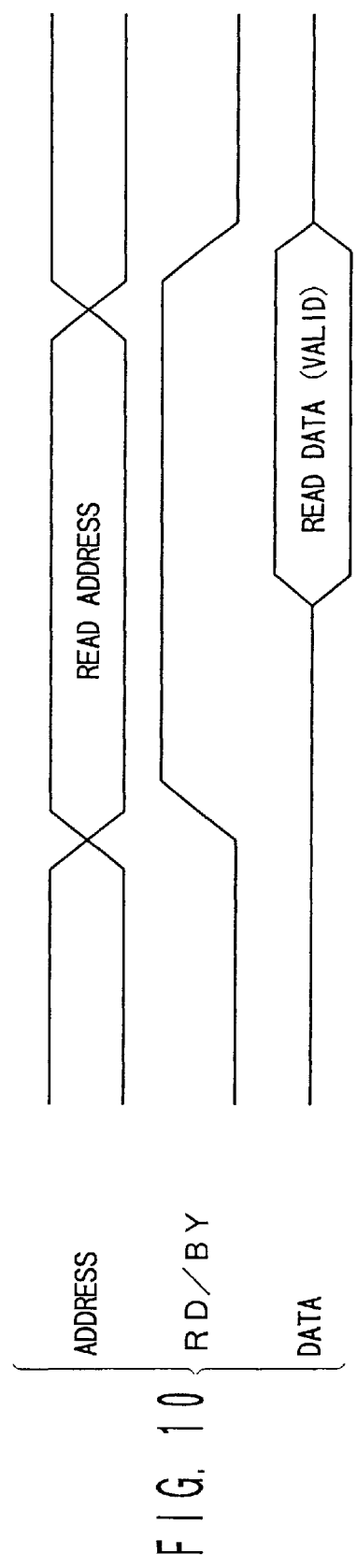
FIG. 10 is a timing chart showing operation of the fourth embodiment of the semiconductor memory device according to the present invention.

FIG. 10 is a timing chart showing operation of the fourth embodiment of the semiconductor memory device according to the present invention.

In FIG. 10, the signal output at the RD/BY terminal 43 is HIGH. When the signal HIGH at the RD/BY terminal 43 indicates a valid status of read data, it is ascertained that data read as shown at the bottom of FIG. 10 in response to a read address supplied as shown at the top of FIG. 10 is valid. If the signal output at the RD/BY terminal 43 is LOW, on the other hand, it is ascertained that the read data shown at the bottom of FIG. 10 read in response to the read address shown at the top of FIG. 10 is invalid.

In this manner, the flash memory 10D of FIG. 9 is provided with no dedicated output terminals, but allows a check to be made from outside the flash memory 10D as to whether data read from the flash memory 10D is valid or invalid.

In the following, limitations and disadvantages of the related art will be described in connection with a second principle of the present invention.

In a non-volatile semiconductor memory device capable of a dual operation, an ideal ratio of a memory size of a first bank to a memory size of a second bank may vary depending on user preference. In order to satisfy varying user preference, a dual-operation-type flash memory employs a sliding bank scheme.

Figure 11:
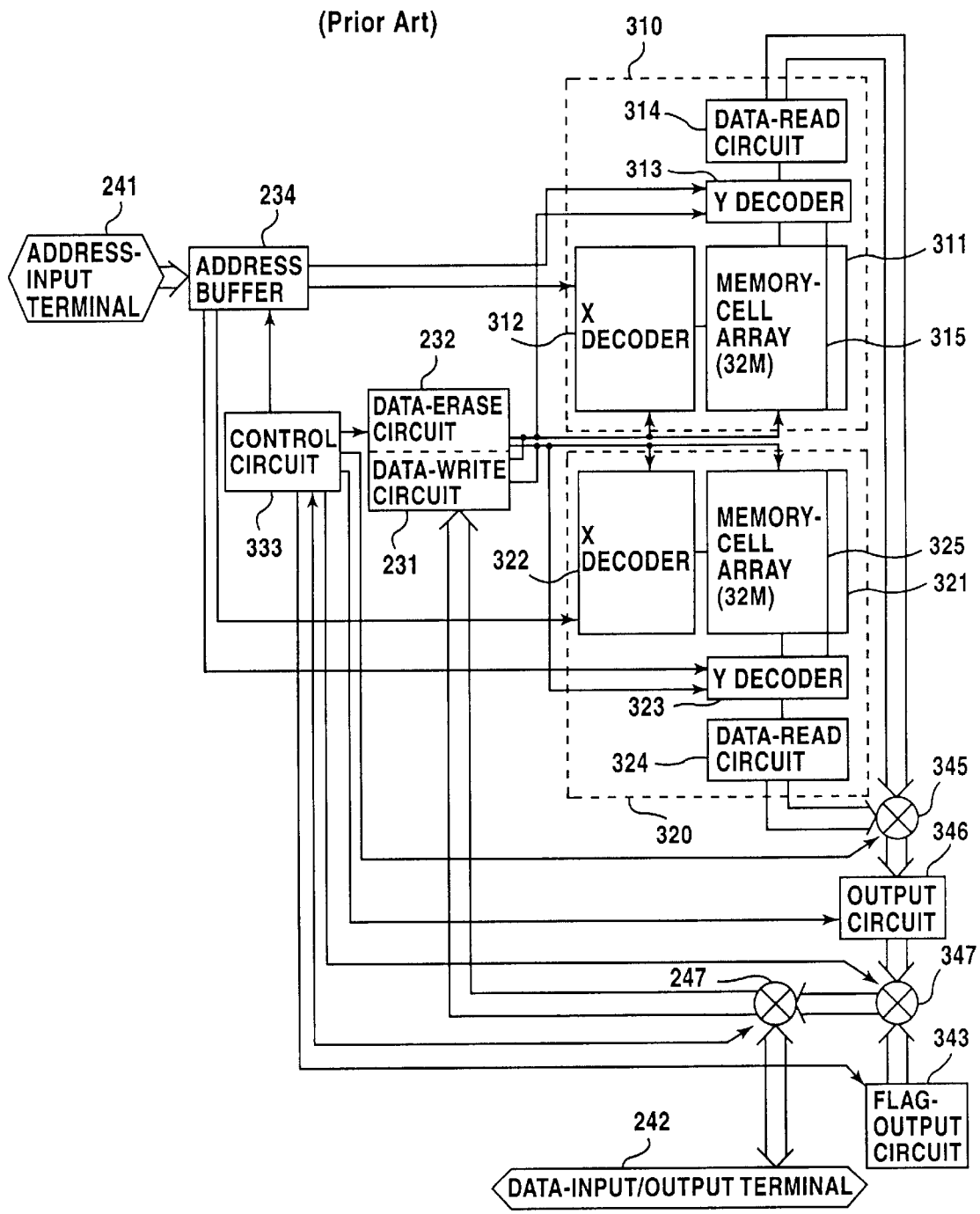
FIG. 11 is a block diagram showing a configuration of a non-volatile semiconductor memory device employing a sliding bank scheme.

FIG. 11 is a block diagram showing a configuration of a non-volatile semiconductor memory device employing a sliding bank scheme.

A non-volatile semiconductor memory device of FIG. 11 includes a bank 310, a bank 320, a data-write circuit 231, a data-erase circuit 232, a control circuit 333, an address buffer 234, an address-input terminal 241, a data-input/output terminal 242, a selector 247, a flag-output circuit 343, a selector 345, a selector 347, and an output circuit 346. The bank 310 includes a memory-cell array 311, an X decoder 312, a Y decoder 313, and a data-read circuit 314. The bank 320 includes a memory-cell array 321, an X decoder 322, a Y decoder 323, and a data-read circuit 324. Bit lines 315 and 325 are connected to drain nodes of memory cells. When selected by the Y decoders 313 and 323, the bit lines 315 and 325 are connected to the data-read circuits 314 and 324, respectively.

In the sliding bank scheme, a ratio of memory sizes between the bank 310 and the bank 320 can be changed by selecting a bank boundary between the bit line 315 and the bit line 325. In the example of FIG. 11, the memory-cell array 311 and the memory-cell array 321 each have a memory size of 32 Mbits, providing a total memory size of 64 Mbits.

Figure 12:
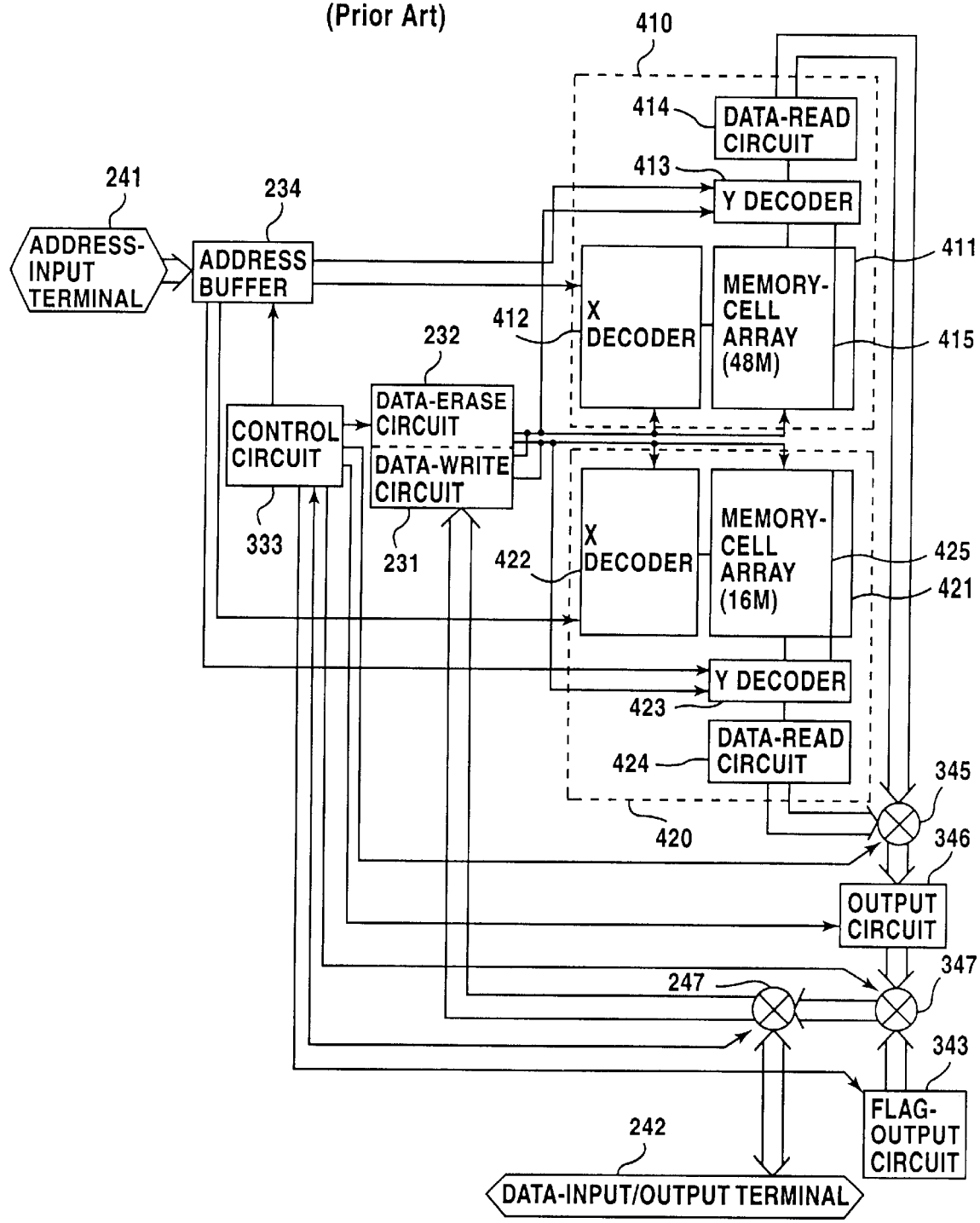
FIG. 12 is a block diagram showing another configuration of a non-volatile semiconductor memory device employing a sliding bank scheme.

FIG. 12 is a block diagram showing another configuration of a non-volatile semiconductor memory device employing a sliding bank scheme.

The semiconductor memory device of FIG. 12 has an almost identical configuration to that of FIG. 11, and includes a bank 410 and a bank 420. The bank 410 includes a memory-cell array 411, an X decoder 412, a Y decoder 413, and a data-read circuit 414. The bank 420 includes a memory-cell array 421, an X decoder 422, a Y decoder 423, and a data-read circuit 424. The memory-cell array 411 includes a bit line 415, and the memory-cell array 421 includes a bit line 425.

A mask used in a manufacturing process for forming the bit lines 415 and 425 in the respective banks 410 and 420 is changed to have a different arrangement for cutting the bit lines from an arrangement used in FIG. 11. In FIG. 12, the memory-cell array 411 has a memory size of 48 Mbits, and the memory-cell array 421 has a memory size of 16 Mbits.

In this manner, the sliding bank scheme can adjust a ratio of memory sizes between the first bank and the second bank by use of a different mask. However, this method of adjustment requires a different mask for each product type, i.e., for each bank size configuration. This creates an extra burden on use and maintenance of masks during wafer processes and on making, using, and maintenance of test programs for testing products.

As a result, manufacturing of non-volatile semiconductor memory devices that employ the sliding bank scheme suffers decline in the throughput and production efficiency.

Accordingly, there is a need for a semiconductor memory device which provides greater latitude in setting memory sizes of banks.

In the following, embodiments of a second principle of the present invention will be described with reference to the accompanying drawings.

FIG. 13 is a block diagram of a first embodiment of a semiconductor memory device according to the second principle of the present invention.

A non-volatile semiconductor memory device of FIG. 13 includes a first block 110, a second block 120, a third block 130, a fourth block 140, a data-read circuit 150, a data-write circuit 151, a data-erase circuit 152, a control circuit 153, an address buffer 154, an address-input terminal 161, a data-input/output terminal 162, a flag-output circuit 156, selectors 157 through 159, and an output circuit 155. The first block 110 includes a memory-cell array 111 that is a flash memory having a memory size of 24 Mbits, an X decoder 112, and a Y decoder 113. The second block 120 includes a memory-cell array 121 that is a flash memory having a memory size of 24 Mbits, an X decoder 122, and a Y decoder 123. The third block 130 includes a memory-cell array 131 that is a flash memory having a memory size of 8 Mbits, an X decoder 132, and a Y decoder 133. The fourth block 140 includes a memory-cell array 141 that is a flash memory having a memory size of 8 Mbits, an X decoder 142, and a Y decoder 143.

The address buffer 154 is connected to the address-input terminal 161, and, also, is connected to the X decoders 112, 122, 132, and 142 as well as the Y decoders 113, 123, 133, and 143. The address-input terminal 161 is further connected to the control circuit 153. The data-write circuit 151 and the data-erase circuit 152 are connected to the control circuit 153 and the selector 158, and are connected to the blocks 110, 120, 130, and 140. The selector 159 is connected to the Y decoders 113, 123, 133, and 143, and is connected to the data-read circuit 150. The data-read circuit 150 is connected to the selector 157. The flag-output circuit 156 is connected to the control circuit 153 and to the selector 157. The output circuit 155 is connected to the selectors 157 and 158. The data-input/output terminal 162 is connected to the selector 158. The selectors 157 and 158 are connected to the control circuit 153.

The non-volatile semiconductor memory device as described above employs a local-decoding scheme. Here, the local-decoding scheme provides a plurality of blocks (110, 120, 130, and 140), and allows a user to combine the blocks in a manner that the user prefers. According to this scheme, a change in a bank memory-size configuration can be easily made without using a mask option as in the sliding bank scheme.

Here, the term "bank" refers to one block or a group of two or more blocks selected from the blocks 110, 120, 130, and 140, and operates as one data processing unit, which means that a plurality of blocks in the same bank operate together (collaborate) for a given task of data processing.

FIG. 14 is a table showing different ways the four blocks shown in FIG. 13 are combined according to the local-decoding scheme.

As shown in the table of FIG. 14, there are four ways to combine the blocks 110, 120, 130, and 140. In a first combination, the first block 110, the second block 120, and the third block 130 are combined to form the first bank, and the fourth block 140 serves as the second bank. In this case, the memory size of the first bank is 56 Mbits, and the memory size of the second bank is 8 Mbits.

In what follows, operation of the non-volatile semiconductor memory device of FIG. 13 will be described.

When data is to be written in memory cells, a write command and data to be written are supplied to the data-input/output terminal 162, and a write address is supplied to the address-input terminal 161. The write command is supplied from the data-input/output terminal 162 to the control circuit 153 via the selector 158. In response to the write command, the control circuit 153 controls the data-write circuit 151 to write the data in selected memory cells. The date-write circuit 151 supplies the write data to the memory-cell arrays 111, 121, 131, and 141 when receiving the write data from the data-input/output terminal 162 via the selector 158. The memory cells are selected by the X decoders 112, 122, 132, and 142 and the Y decoders 113, 123, 133, and 143 when these decoders receive the write address from the address buffer 154.

In the manner described above, the write data is written in the memory cells selected by the write address. A data-erase operation is performed in much the same manner. Namely, when an erase command is entered at the data-input/output terminal 162, the data-erase circuit 152 erases data stored in memory cells where these memory cells are specified by an address entered at the address-input terminal 161.

In the case of a data-read operation, a read address is supplied to the address-input terminal 161, and the control circuit 153 attends to control to read data from specified memory cells. The selector 159 connects one of the Y decoders to the data-read circuit 150 where the selected Y decoder includes the specified memory cells. The memory cells are selected by the X decoders 112, 122, 132, and 142 and the Y decoders 113, 123, 133, and 143 when these decoders receive the read address from the address buffer 154.

In the non-volatile semiconductor memory device employing the local-decoding scheme according to the present embodiment, each block can operate independently from the other blocks, so that a data-read operation can be performed in one block while a data-write or data-erase operation is performed in another block. For example, when data is erased in the first block 110, the data-erase circuit 152 dedicates itself to the control of the first block 110. When the control circuit 153 receives a data-read command to read data from the third block 130, the data-read circuit 150 dedicates itself to the control of the third block 130. In this manner, a dual operation is achieved.

If the control circuit 153 receives a data-read command to read data from the first block 110 while the first block 110 is undergoing a data-rewrite operation, the control circuit 153 controls the selector 157 such that a flag signal indicative of presence of an ongoing data-rewrite operation in the first block 110 is output to an exterior of the device from the flag-output circuit 156 via the output circuit 155.

Accordingly, the non-volatile semiconductor memory device according to the first embodiment of the second principle allows blocks to be freely combined to form banks, thereby permitting a change in bank size without use of a mask option. Further, since data can be read from a memory-cell array while another memory-cell array has an ongoing data-write or data-erase operation, efficient parallel processing can be achieved.

FIG. 15 is a block diagram showing a configuration of a non-volatile semiconductor memory device according to a second embodiment of the second principle. The non-volatile semiconductor memory device of FIG. 15 differs from that of FIG. 13 only in that a non-volatile-bank-memory circuit 71 and an address-conversion circuit 72 are additionally provided.

The non-volatile-bank-memory circuit 71 is connected to a control circuit 53. The address-conversion circuit 72 is provided between the address-input terminal 161 and the address buffer 154, and is connected to the non-volatile-bank-memory circuit 71.

In the non-volatile semiconductor memory device of FIG. 13 previously described, when the first block 110 and the second block 120 together form a first bank, and the third block 130 and the fourth block 140 together make up a second bank, data is read from memory cells of the second block 120 specified by a read address even if the read address is supplied during a process of rewriting data in the first block 110. In a typical non-volatile semiconductor memory device employing a dual-operation scheme, however, if an address within the second block is entered while data is being rewritten in the first block, a flag signal indicative of an ongoing data-rewrite operation is output since the first block and the second block belong to the same bank.

Namely, the non-volatile semiconductor memory device employing the local-decoding scheme according to the first embodiment of the second principle operates in a different fashion than does a conventional non-volatile semiconductor memory device of a dual-operation type. In such a case, compatibility cannot be insured.

If there is information about which banks include the blocks 110, 120, 130, and 140, a check can be made inside the chip as to whether an accessed block belongs to the same bank as a block having an ongoing data-rewrite operation. If the same bank includes these two blocks, a flag signal indicative of presence of an ongoing data-rewrite operation may be output.

In consideration of this, the non-volatile semiconductor memory device according to the second embodiment of the second principle includes the non-volatile-bank-memory circuit 71, which stores therein bank numbers provided for respective blocks. Each bank number indicates which bank includes a corresponding one of the blocks 110, 120, 130, and 140. Such bank numbers are stored in the non-volatile-bank-memory circuit 71 by the manufacturer of the device or a user. When the first block 110 and the third block 130 together form the first bank, and the second block 120 and the fourth block 140 together make up a second bank, for example, these correspondences between the blocks and the banks are stored in the non-volatile-bank-memory circuit 71. When data in the first block 110 belonging to the first bank is to be rewritten, the control circuit 53 controls the data-write circuit 151 and the data-erase circuit 152 to rewrite the data in the first block 110.

While the data is being rewritten as described above, a block different from the block having the data being rewritten may be accessed for data-read operation. In such a case, the control circuit 53 controls the selector 159 to connect the accessed block to the data-read circuit 150. If the accessed block is either the second block 120 or the fourth block 140, data is to be read from the second bank, which is different from the first bank that includes the first block 110 having data thereof being rewritten. As a result, an output of the data-read circuit 150 is directed to the data-input/output terminal 162 via the output circuit 155 under the control of the control circuit 53.

In a different scenario, while the data is being rewritten as described above, an address may be supplied from the exterior of the device to select the third block 130 as a block from which data is to be read. In this case, the data is to be read from the same bank as that which includes the first block 110 having the data thereof being rewritten. The control circuit 53 controls the selector 157 so that a flag signal indicative of presence of an ongoing data-write operation is supplied from the flag-output circuit 156 to the data-input/output terminal 162 via the output circuit 155.

In the operations as described above, the control circuit 53 refers to the correspondences between the blocks and the banks stored in the non-volatile-bank-memory circuit 71, and checks whether a block specified by a read address supplied from the exterior of the device belongs to the same bank as that of a block having data thereof being rewritten.

In this manner, use of the non-volatile-bank-memory circuit 71 makes it possible to insure compatibility between a non-volatile semiconductor memory device of the local-decoding scheme according to the present invention and a conventional non-volatile semiconductor memory device of a dual-operation type.

In a configuration where the first block 110 and the third block 130 together form the first bank, and the second block 120 and the fourth block 140 together make up the second bank, for example, an internal address system for specifying the banks become discontinuous, thereby causing inconveniences to users by creating a undesirable need for modifying control-purpose software. In consideration of this, the non-volatile semiconductor memory device according to the present embodiment is provided with the address-conversion circuit 72, which converts external addresses based on a continuous address system into internal addresses based on the discontinuous address system. In the following, the address-conversion circuit 72 will be described in detail.

As is shown in FIG. 14, the memory cell array having a memory size of 64 Mbits, which includes the first and second blocks each having a size of 24 Mbits and the third and fourth blocks each having a size of 8 Mbits, will be used as an example. With 16 bits constituting one word, any one address is comprised of 22 bits from A0 to A21, among which 3 bits from A19 to A21 are necessary to select one of the four blocks. The reason why 3 bits become necessary to select one of the four blocks is that each of the first and second blocks is actually comprised of three memory-cell arrays each having a size of 8 Mbits and selected independently of each other.

FIG. 16 is a table showing bank addresses for selecting one of the four blocks.

As shown in FIG. 16, a bank address (A19, A20, A21) having a logic-level combination (L, H, H) results in selection of the third block. Since the first block is comprised of the three memory-cell arrays a size of 8 Mbits each, three logic-level combinations (L, L, L), (L, L, H), and (L, H, L) are assigned to the first block to select one of these three memory-cell arrays. The same also applies in the case of the second block.

In the table of FIG. 14, discontinuity of addresses within the same bank appears in the cases of a third combination and a fourth combination. Namely, the third combination has addresses in the first bank that start from addresses of the first block, and leap to addresses of the third block and the fourth block without having an intervening second block, so that a discontinuity appears between the first block and the third block. Further, the fourth combination has addresses in the first bank that start from addresses of the first block, and leap to addresses of the third block without following the addresses of the second block, and, also, has addresses in the second bank that start from addresses of the second block, and jump to the addresses of the fourth block without having an intervening third block.

In order to avoid such address discontinuity, the address-conversion circuit 72 refers to the correspondences between the blocks and the banks stored in the non-volatile-bank-memory circuit 71, and converts externally provided addresses based on the continuous address system into internal addresses based on the discontinuous address system.

Figure 17:
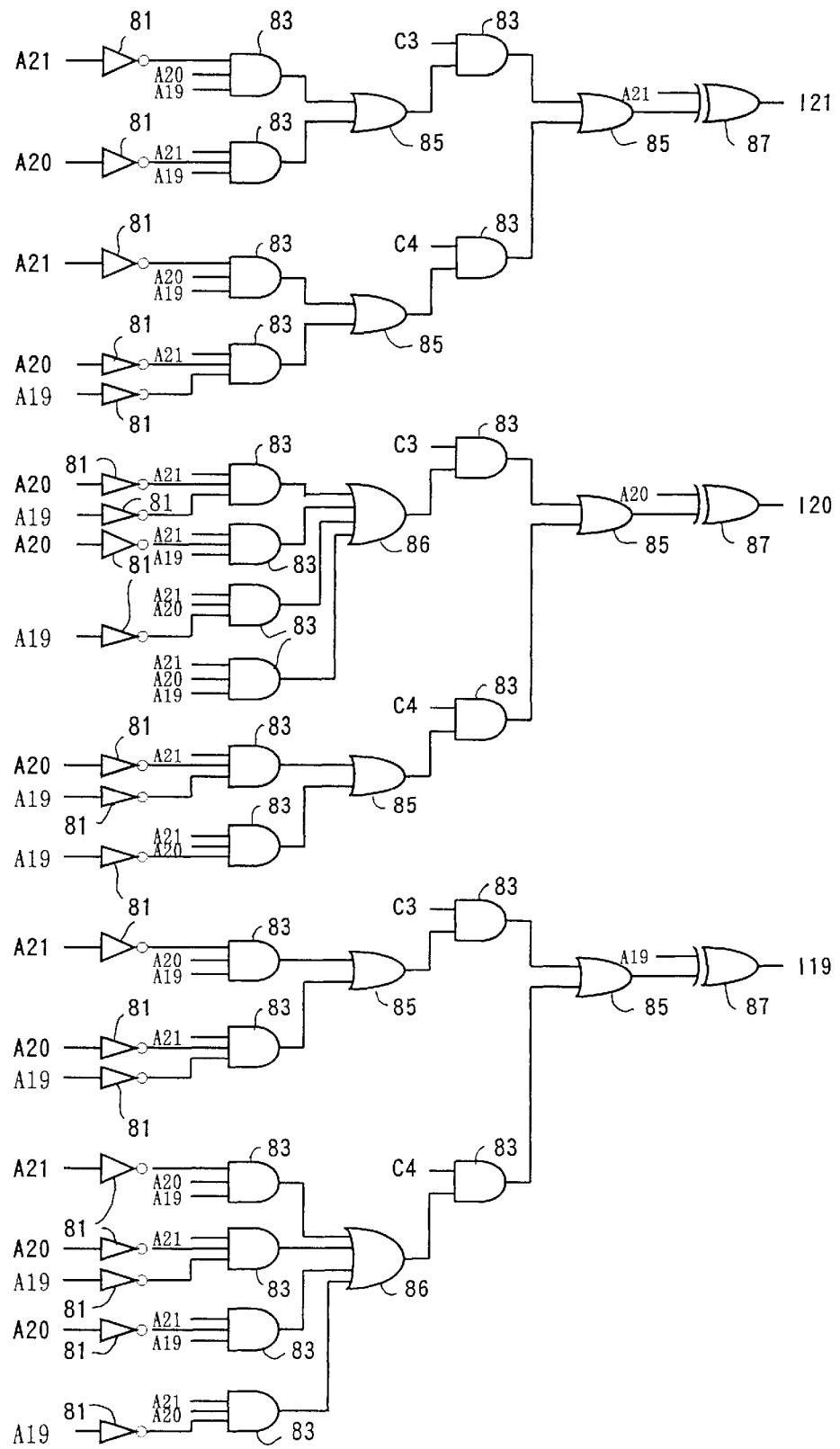
FIG. 17 is a circuit diagram of an address-conversion circuit shown in FIG. 15.

FIG. 17 is a circuit diagram of the address-conversion circuit 72 shown in FIG. 15.

As shown in FIG. 17, the address-conversion circuit 72 includes the exclusive OR circuits 87, OR circuits 85 and 86, AND circuits 83, and inverters 81. The address-conversion circuit 72 of FIG. 17 receives the bank address (A19, A20, A21) from the exterior of the semiconductor memory device, and converts the bank address into an internal address (I19, I20, I21). In FIG. 17, signals C3 and C4 are supplied from the non-volatile-bank-memory circuit 71 based on the information stored therein. The signals C3 and C4 are respectively HIGH and LOW in the case of the third combination shown in the table of FIG. 14, and are LOW and HIGH, respectively, in the case of the fourth combination.

FIG. 18 is a table showing relations between bank address inputs and internal address outputs of the address-conversion circuit 72.

As shown in the table of FIG. 18, the address-conversion circuit 72 of FIG. 17 receives external addresses that show continuity in address increase from (L, L, L) to (H, H, H). When the bank-information signals C3 and C4 are HIGH and LOW, respectively, the address-conversion circuit 72 converts the continuous external addresses into internal addresses such that as the external addresses change from (L, L, L) to (H, L, L), the internal addresses change from addresses of the first block, addresses of the third block, to addresses of the fourth block, all of which correspond to the addresses of the first bank. Further, when the external addresses change from (H, L, H) to (H, H, H), the internal addresses stay within the second block that corresponds to the second bank.

When the bank-information signals C3 and C4 are LOW and HIGH, respectively, the address-conversion circuit 72 converts the continuous external addresses into internal addresses such that as the external addresses change from (L, L, L) to (L, H, H), the internal addresses change from addresses of the first block to addresses of the third block, all of which correspond to the addresses of the first bank. Further, as the external addresses change from (H, L, L) to (H, H, H), the internal addresses change from addresses of the second block to addresses of the fourth block, all of which correspond to the addresses of the second bank.

In this manner, use of the address-conversion circuit 72 in the non-volatile semiconductor memory device allows a continuous address system to be used when supplying an external addresses to the device to access the banks. This eliminates a need for users to modify control-purpose software.

As described above, the non-volatile semiconductor memory device according to the second embodiment of the second principle permits its use in the same system environment as the related-art device of a dual-operation type is used, and, also, can provide greater latitude in selecting a memory size configuration.

Further, the present invention is not limited to these embodiments, but various variations and modifications may be made without departing from the scope of the present invention.

The present application is based on Japanese priority applications No. 11-130109 filed on May 11, 1999 and No. 11-324339 filed on Nov. 15, 1999 with the Japanese Patent Office, the entire contents of which are hereby incorporated by reference.

What is claimed is:

1. A non-volatile semiconductor memory of a dual operation type, comprising:
    a plurality of memory areas;
    a control unit which performs a data-write or data-erase operation with respect to one of said memory areas;
    data-read circuits which are provided for the respective memory areas, and performs a data-read operation in a selected memory area different from the one of said memory areas having the data-write or data-erase operation being performed therein if a data-read operation for the selected memory area is requested;
    an address-detection unit which detects an address that indicates the one of said memory areas having the data-write or data-erase operation performed therein, and supplies information indicative of the address; and
    at least one output terminal which supplies the information to an exterior of said device.

2. The non-volatile semiconductor memory as claimed in claim 1, wherein said at least one output terminal is a terminal dedicated for a purpose of outputting the information supplied from said address-detection unit.

3. The non-volatile semiconductor memory as claimed in claim 1, further comprising a selector unit which selects either the information supplied from said address-detection unit or other information, wherein said at least one output terminal supplies the selected information selected by said selector unit to the exterior of said device.

4. The non-volatile semiconductor memory as claimed in claim 1, further comprising:
   a data-write/erasure unit which writes or erases data in one of the memory areas at a time; and
   a plurality of data-read units respectively provided for said memory areas.

5. A non-volatile semiconductor memory of a dual operation type, comprising:
   a plurality of memory areas;
   a control unit which performs a data-write or data-erase operation with respect to one of said memory areas;
   data-read circuits which are provided for the respective memory areas, and perform a data-read operation in a selected memory area and different from the one of said memory areas having the data-write or data-erase operation being performed therein if a data-read operation is requested together with a read address indicative of the selected memory area;
   an address-detection unit which detects an address that indicates the one of said memory areas having the data-write or data-erase operation performed therein, and supplies information indicative of the address;
   a comparator which compares the address detected by said address-detection unit with the read address supplied to said device; and
   at least one output terminal which supplies a result of the comparison to an exterior of said device.

6. The non-volatile semiconductor memory as claimed in claim 5, wherein said at least one output terminal is a terminal dedicated for a purpose of outputting the result of the comparison.

7. The non-volatile semiconductor memory as claimed in claim 5, further comprising a selector unit which selects either the information supplied from said address-detection unit or other information, wherein said at least one output terminal supplies the selected information selected by said selector unit to the exterior of said device.

8. The non-volatile semiconductor memory as claimed in claim 5, further comprising:
   a data-write/erasure unit which writes or erases data in one of the memory areas at a time; and
   a plurality of data-read units respectively provided for said memory areas.

9. A non-volatile semiconductor memory of a dual operation type, comprising:
   three or more memory-cell blocks;
   a control unit which organizes said memory-cell blocks into a plurality of groups, and controls the memory-cell blocks in each of said plurality of groups to operate as one unit separately from the memory-cell blocks of other groups;
   a data-write/erase unit which writes or erases data in one of said memory-cell blocks; and
   a data-read unit which reads data from one of said memory-cell blocks, wherein said control unit controls said data-read unit to read data from one of said memory-cell blocks that is different from one of said memory-cell blocks in which said data-write/erase unit is writing or erasing data.

10. The non-volatile semiconductor memory as claimed in claim 9, further comprising a flag-output circuit which outputs a signal indicative of presence of an ongoing data-rewrite operation to an exterior of said device when a read command is entered into said device to request a data-read operation to read data from one of said memory-cell blocks that belongs to the same group as that including one of said memory-cell blocks in which said data-write/erase unit is writing or erasing data.

11. The non-volatile semiconductor memory as claimed in claim 9, wherein one of said memory-cell blocks has a memory size different from that of another one of said memory-cell blocks.

12. The non-volatile semiconductor memory as claimed in claim 9, further comprising an address-conversion unit which converts external addresses supplied from an exterior of said device into internal addresses, the external addresses being continuous within a memory space of one group, and the internal addresses being discontinuous within the memory space of said one group.

13. The non-volatile semiconductor memory as claimed in claim 12, further comprising a table-memory unit which stores data indicating which memory-cell block belongs to which group, and an address-conversion unit which converts the external addresses into the internal addresses based on the data stored in said table-memory unit.

14. A method of controlling a non-volatile semiconductor memory including three or more memory-cell blocks, comprising the steps of:
   organizing the memory-cell blocks into a plurality of groups so as to control the memory-cell blocks in each of the plurality of groups to operate as one unit separately from the memory-cell blocks of other groups;
   reading data from one of the memory-cell blocks while writing or erasing data in another one of the memory-cell blocks.

15. The method as claimed in claim 14, further comprising a step of converting external addresses supplied from an exterior of the device into internal addresses, the external addresses being continuous within a memory space of one group, and the internal addresses being discontinuous within the memory space of said one group.

16. A method of controlling a non-volatile semiconductor memory including three or more memory-cell blocks, comprising the steps of:
   organizing the memory-cell blocks into a plurality of groups so as to control the memory-cell blocks in each of the plurality of groups to operate as one unit separately from the memory-cell blocks of other groups; and
   outputting a signal indicative of presence of an ongoing data-rewrite operation to an exterior of the non-volatile semiconductor memory when a read command is entered into the device to request a data-read operation to read data from one of the memory-cell blocks that belongs to a group while data is being written or being erased in one of the memory-cell blocks in the same group.

17. The method as claimed in claim 16, further comprising a step of converting external addresses supplied from an exterior of the device into internal addresses, the external addresses being continuous within a memory space of one group, and the internal addresses being discontinuous within the memory space of said one group.

* * * * *